(12) United States Patent
Liu et al.

(10) Patent No.: US 11,175,338 B2
(45) Date of Patent: Nov. 16, 2021

(54) SYSTEM AND METHOD FOR COMPACTING TEST DATA IN MANY-CORE PROCESSORS

(71) Applicant: Alibaba Group Holding Limited, Grand Cayman (KY)

(72) Inventors: Chunsheng Liu, Hangzhou (CN); Arjun Chaudhuri, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 16/732,150

(22) Filed: Dec. 31, 2019

(65) Prior Publication Data

US 2021/0199717 A1 Jul. 1, 2021

(51) Int. Cl.
- G01R 31/3177 (2006.01)
- G01R 31/317 (2006.01)
- H03K 19/21 (2006.01)
- H03K 19/20 (2006.01)

(52) U.S. Cl.
CPC ... G01R 31/3177 (2013.01); G01R 31/31703 (2013.01); H03K 19/20 (2013.01); H03K 19/21 (2013.01)

(58) Field of Classification Search
CPC .......... G01R 31/3177; G01R 31/31703; H03K 19/20; H03K 19/21
See application file for complete search history.

(56) References Cited

U.S. PATENT DOCUMENTS

| | | | |
|---|---|---|---|
| 5,475,694 A | 12/1995 | Ivanov et al. | |
| 6,557,129 B1 | 4/2003 | Rajski et al. | |
| 6,671,539 B2 * | 12/2003 | Gateno | A61B 17/6433 600/426 |
| 6,728,901 B1 | 4/2004 | Rajski et al. | |
| 7,412,672 B1 | 8/2008 | Wang et al. | |
| 7,437,640 B2 * | 10/2008 | Rajski | G01R 31/318566 714/729 |
| 7,716,548 B2 | 5/2010 | Cheng et al. | |
| 7,743,302 B2 | 6/2010 | Rajski et al. | |
| 7,818,642 B2 | 10/2010 | Kim et al. | |
| 7,925,947 B1 | 4/2011 | Touba et al. | |
| 8,065,651 B2 | 11/2011 | Kapur et al. | |

(Continued)

FOREIGN PATENT DOCUMENTS

| | | |
|---|---|---|
| EP | 2677328 A1 | 12/2013 |
| WO | 2013016989 A1 | 2/2013 |
| WO | 2019033380 A1 | 2/2019 |

*Primary Examiner* — Kyle Vallecillo (57) ABSTRACT

A method for testing a many-core processor comprises grouping a plurality of cores in the processor into a plurality of super cores, wherein each super core comprises one or more scan chains that propagate through a respective super core. Further, the method comprises grouping the plurality of super cores into a plurality of clusters. The method also comprises comparing one or more scan chain outputs of respective super cores in each cluster using a network of XOR and OR gates to generate a single bit fault signature for each scan chain in a respective cluster and compacting the single bit fault signatures for each scan chain using a hybrid of spatial and temporal compactors to generate a single bit fault signature for each cluster. The method also comprises method of using a cost function to obtain hierarchical parameters to achieve optimized ATPG effort, area overhead and test time.

18 Claims, 10 Drawing Sheets

(56) References Cited

U.S. PATENT DOCUMENTS

| | | | |
|---|---|---|---|
| 8,161,338 B2 | 4/2012 | Rajski et al. | |
| 8,280,687 B2 | 10/2012 | Cheng et al. | |
| 8,373,435 B2* | 2/2013 | Bogenberger | G06F 11/165 |
| | | | 326/21 |
| 8,522,096 B2 | 8/2013 | Wang et al. | |
| 8,898,529 B2 | 11/2014 | Goessel et al. | |
| 9,170,301 B1 | 10/2015 | Gallagher et al. | |
| 9,404,969 B1* | 8/2016 | Keller | G01R 31/318547 |
| 9,864,004 B1* | 1/2018 | Chillarige | G06F 11/00 |
| 9,892,053 B2 | 2/2018 | Nilsson et al. | |
| 10,192,350 B2 | 1/2019 | Peterson et al. | |
| 2006/0176206 A1* | 8/2006 | Chae | G06F 7/02 |
| | | | 341/169 |
| 2006/0200719 A1* | 9/2006 | Keller | G01R 31/318547 |
| | | | 714/732 |
| 2006/0236186 A1 | 10/2006 | Wang et al. | |
| 2007/0234150 A1* | 10/2007 | Jain | G01R 31/318544 |
| | | | 714/726 |
| 2007/0260823 A1 | 11/2007 | Dickinson et al. | |
| 2008/0104467 A1* | 5/2008 | Satsukawa | G01R 31/318594 |
| | | | 714/729 |
| 2010/0121585 A1* | 5/2010 | Wang | G01R 31/318547 |
| | | | 702/59 |
| 2011/0214026 A1 | 9/2011 | Rajski et al. | |
| 2011/0296266 A1* | 12/2011 | Song | G01R 31/31726 |
| | | | 714/731 |
| 2011/0307750 A1 | 12/2011 | Narayanan et al. | |
| 2013/0173979 A1 | 7/2013 | Goessel et al. | |
| 2017/0328952 A1* | 11/2017 | Huang | H03L 7/23 |
| 2018/0018257 A1* | 1/2018 | Miki | G06F 16/00 |
| 2018/0322390 A1 | 11/2018 | Das et al. | |
| 2019/0018910 A1 | 1/2019 | Xiang | |

* cited by examiner

SYSTEM AND METHOD FOR COMPACTING TEST DATA IN MANY-CORE PROCESSORS

FIELD OF THE INVENTION

Embodiments according to the present invention relate to a method for facilitating testing by compacting processor test result data.

BACKGROUND OF THE INVENTION

In recent years, there has been increasing interest in many-core processors, which find widespread application including in systems implementing artificial neural networks (ANNs). Many-core processors can be distinguished from multicore processors because while multicore processors may only combine two or more independent cores into a single package composed of a single integrated circuit, many-core processors comprise hundreds or even thousands more cores than a multicore processor. Many-core processors are, therefore, specialized multicore processors designed for a high degree of parallel processing and comprise numerous simpler processor cores. Many-core processors are used extensively in embedded computers and high-performance computing.

Many-core processors typically comprise many small identical cores or processing engines on the same chip. For an Artificial Intelligence (AI) related application (e.g., a system implementing an ANN), for example, the processing engine comprises the fundamental computing block for the AI accelerator.

Testing many-core processors can pose a significant challenge because of the sheer amount of data that is generated by the large amount of cores. For example, for a typical AI accelerator, especially those used in cloud-based applications, the automatic test pattern generation (ATPG) time (a process for software to generate test patterns), test response collection time, and memory requirements are extremely high, which can contribute significantly to the cost factor associated with the design.

Conventional test compression tools designed by Electronic Design Automation (EDA) can compact test results, but they do not take into account the many-core structure of the processors. Instead, they treat all the cores as a single piece of random logic and perform compaction on the collective results obtained from all the cores comprised within the single piece of logic. In other words, conventional methods do not take advantage of the similarities between all the smaller cores of a many-core processor to further reduce or compact the test results. As a result, conventional test compression methods are simply not efficient with respect to data volume and cost. For the same reason, conventional EDA tools are not scalable with respect to the size of the design, which becomes exceedingly problematic for many-core systems that comprise of thousands or even tens of thousands of cores.

BRIEF SUMMARY OF THE INVENTION

Accordingly, a need exists for a test methodology that can address the problems with the systems described above. Using the beneficial aspects of the systems described, without their respective limitations, embodiments of the present invention provide novel solutions to address these problems.

Embodiments of the present invention enable a hierarchical test solution that can take advantage of core similarity in many-core processors and significantly reduce automatic test pattern generation (ATPG) time, memory requirements and test execution time. Many-core processors may include but are not limited to neural network processors, Digital Signal Processors (DSP), and Central Processing Units (CPU). By comparing and compacting the outputs of the several cores before transmitting the test results to the tester, embodiments of the present invention are able to take advantages of the similarities in the test data generated by the cores. In this way, fewer bits are needed for transmitting to the tester for analysis, which drastically reduces test time and cost.

Embodiments of the present invention further relate to a hierarchical test compaction scheme that utilizes a hybrid combination of spatial (e.g. using combinational logic) and temporal (e.g. using sequential logic) compactors. By comparing data from similar cores of a many-core processor instead of downloading data from all the cores to the tester, embodiments of the present invention advantageously save test time and cost with low hardware overhead. Further, embodiments of the present invention advantageously provide a compaction scheme that is scalable, flexible and makes it easier to implement debug capability.

In one embodiment, a computer-implemented method of testing a many-core processor is disclosed. The method comprises grouping a plurality of cores comprised within the many-core processor into a plurality of super cores, wherein each super core comprises one or more scan chains that propagate there through, wherein each super core comprises a respective subset of the plurality of cores. The method further comprises grouping the plurality of super cores into a plurality of first level clusters, wherein the plurality of first level clusters comprise clusters at a first level of a hierarchical cluster configuration, wherein each first level cluster of the plurality of first level clusters comprises a respective subset of the plurality of super cores, and wherein a respective scan chain traversing each super core in a first level cluster is identical to respective scan chains traversing other super cores in a same first level cluster. Further, the method comprises comparing one or more scan chain outputs of respective super cores in each first level cluster using a network of combinational logic to generate a single bit fault signature for each scan chain in a respective first level cluster. Finally, the method comprises compacting respective single bit fault signatures for each scan chain in each first level cluster using a first compactor to generate a single bit fault signature for a respective first level cluster.

In another embodiment, a non-transitory computer-readable storage medium having stored thereon, computer executable instructions that, if executed by a computer system cause the computer system to perform a method of testing a many-core processor is disclosed. The method comprises grouping a plurality of cores comprised within the many-core processor into a plurality of super cores, wherein each super core comprises a scan chain that propagates there through, wherein each super core comprises a respective subset of the plurality of cores. The method further comprises grouping the plurality of super cores into a plurality of first level clusters, wherein the plurality of first level clusters comprise clusters at a first level of a hierarchical cluster configuration, wherein each first level cluster of the plurality of first level clusters comprises a respective subset of the plurality of super cores, and wherein a respective scan chain traversing each super core in a first level cluster is identical to a respective scan chain traversing other super cores in a same first level cluster. The method further comprises comparing a scan chain output of respective super cores in each first level cluster using a network of combinational logic to generate a single bit fault signature for each first level cluster. Finally, the method comprises compacting respective single bit fault signatures of each first level cluster using a first compactor to generate a single bit fault signature for the plurality of first level clusters.

In one embodiment, a system for performing a method of testing a many-core processor is disclosed. The system comprises a processing device communicatively coupled with a memory and configured to: a) group a plurality of cores comprised within the many-core processor into a plurality of super cores, wherein each super core comprises one or more scan chains that propagates there through, wherein each super core comprises a respective subset of the plurality of cores; b) group the plurality of super cores into a plurality of first level clusters, wherein the plurality of first level clusters comprise clusters at a first level of a hierarchical cluster configuration, wherein each first level cluster of the plurality of first level clusters comprises a respective subset of the plurality of super cores; c) compare one or more scan chain outputs of respective super cores in each first level cluster using a network of combinational logic to generate a single bit fault signature for each scan chain in a respective first level cluster for each clock cycle; and d) compact respective single bit fault signatures for each scan chain in each first level cluster using a first compactor to generate a single bit fault signature for a respective first level cluster for each clock cycle.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "grouping," "comparing," "compacting," "generating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

System and Method for Compacting Test Data in Many-Core Processors

Typically, many-core processors (e.g., large neural network accelerators) require excessive test pattern generation efforts including many hours of run time, a significant amount of disk space and several man hours. Further, the large test patterns and long test times result in higher processor cost. Conventional test methods treat the entire homogeneous processing array of a many-core architecture (comprising identical or similar cores) as a single piece of random logic; this results in an unnecessary expenditure of run time, disk-space, test resources and man hours.

Embodiments of the present invention enable a hierarchical test solution to take advantage of the uniform architecture of many-core processors (e.g. processors with multiple identical cores) and significantly reduce automatic test pattern generation (ATPG) time, memory requirements and test execution time. Many-core processors may include but are not limited to neural network processors, AI accelerators, Digital Signal Processors (DSP), and RISC-V processors. By comparing the outputs of the several cores before transmitting the test results to the tester, embodiments of the present invention are able to take advantages of the similarities between the cores and in the test data generated by the similar cores to compact the test data directly on the processor chip. In this way, fewer bits need to be transmitted to the tester for analysis, which drastically reduces test time, storage requirements, and cost.

Embodiments of the present invention further relate to a hierarchical test compaction methodology that utilizes a hybrid combination of both spatial and temporal compactors. By comparing data from similar cores of a many-core processor instead of downloading data from all the cores to the tester, embodiments of the present invention advantageously save test time and cost with low hardware overhead. Further, embodiments of the present invention advantageously provide a compaction methodology that is scalable, flexible and makes easier debug implementation and capability.

Figure 1A:
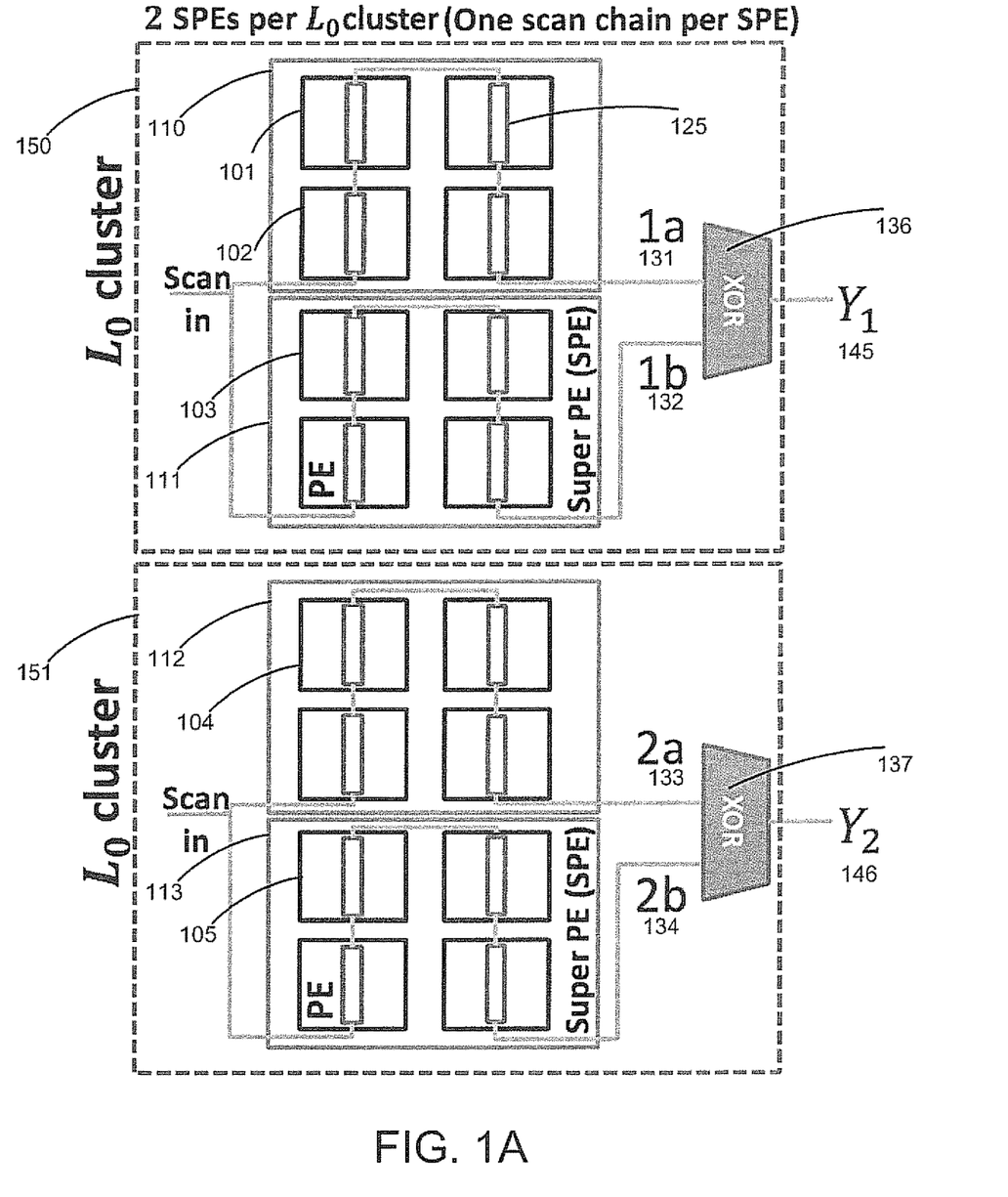
FIG. 1A illustrates a diagram of the manner in which cores of a many-core processor are organized into clusters at the base level of the hierarchical test compaction scheme in accordance with an embodiment of the present invention.

FIG. 1A illustrates the manner in which cores of a many-core processor are organized into clusters at the base level of the hierarchical test compaction scheme in accordance with an embodiment of the present invention. In an embodiment, the cores of a many-core processor are organized into clusters at the base level. For example, FIG. 1A illustrates two clusters 150 and 151 (both labeled $L_0$ clusters to indicate clusters at the base-level or Level-0 of the hierarchy). Note that there may be several hundred or thousand $L_0$ clusters at the base level of a typical many-core chip depending on the size of the processor.

Each of the clusters may comprise one or more super processing engines (SPEs). The embodiment of FIG. 1A, for example, comprises 2 SPEs per cluster, e.g., SPEs 110, 111 in cluster 150 and SPEs 112 and 113 in cluster 151. It is appreciated that a cluster at the base-level is not limited to only 2 SPEs and can also comprise varying numbers of SPEs, e.g., 4, 8, 16, etc. Each of the SPEs in the many-core processor will typically be identical, resulting in a minimum ATPG instance to be handled. In other words, the same test pattern may be generated for all the SPEs because they are identical.

Each SPE may in turn comprise 4 or more processing engines (PEs) or cores, e.g., cores 101, 102, 104 and 105 as shown in FIG. 1A. Note that in different embodiments, each SPE may comprise a different number of cores and that the number of cores in an SPE is variable. Grouping cores into SPEs advantageously enables the outputs of potentially thousands of cores in a many-core processor to be compared efficiently without using an impractically large number of comparators (as will be further explained below).

It is noted that FIG. 1A illustrates an exemplary base-level architecture of the compaction scheme and that different variations with varying numbers of clusters, SPEs per cluster, and PEs per SPE are possible.

Each core may comprise one or more stitched scan chains that propagate through it. For example, scan chain 131 propagates through the cores of SPE 110, scan chain 132 propagates through the cores of SPE 111, scan chain 133 propagates through the cores of SPE 112 and scan chain 134 propagates through the cores of SPE 113. Note that there can be more than one scan chain that traverses a single SPE.

Each scan chain is a single stitched chain comprising chains in multiple PEs inside an SPE. It is appreciated, however, that the scan chain does not need to be a chain that is connected serially through all the PEs in an SPE. For example, one or more scan chains in an SPE may be intermingled through all the PEs in the SPE, where the PEs are collectively treated as one single piece of logic (this configuration will be discussed in more detail in connection with FIG. 2).

Note that the scan chains in each cluster may be identical. For example, in the embodiment of FIG. 1A, scan chain 131 in cluster 150 is identical to scan chain 132. Similarly, scan chain 133 in cluster 151 is identical to scan chain 134. Because the scan chains in each SPE are identical, their outputs can be compared by using an XOR gate in any given clock cycle, e.g., XOR gates 136 and 137.

Figure 1B:
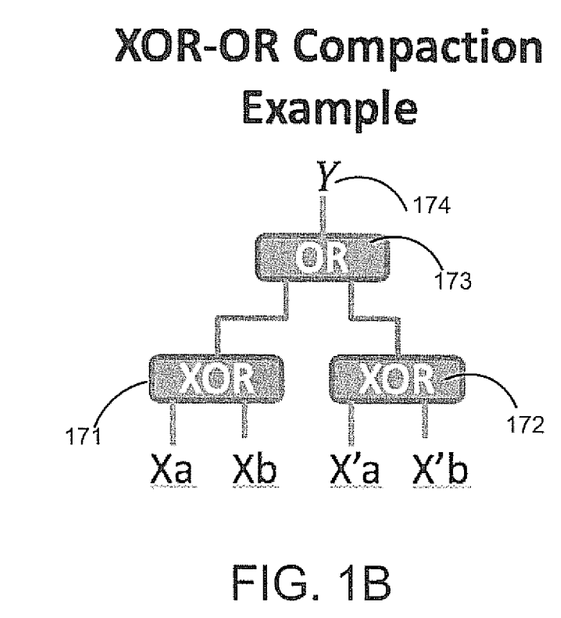
FIG. 1B illustrates the manner in which the scan outputs of multiple super cores at the base level can be compacted using an XOR-OR gate in accordance with an embodiment of the present invention.

Stated differently, for multiple scan chains inserted in 2 SPEs, e.g., (Xa in SPE 1, X' a in SPE 2), (Xb in SPE 1, X'b in SPE 2), associated chains of SPEs in the same $L_0$ cluster are identical (e.g., Xa=Xb, X' a=X'b) and are XOR-ed as shown in FIG. 1B in order to compare the scan chains. Note that Xa, Xb may correlate to signals 1a 131, 1b 132 respectively from FIG. 1A and that X'a, X'b may correlate to signals 2a 133, 2b 134 respectively from FIG. 1A. Referencing FIG. 1A then, scan chain 131 is identical to scan chain 132, while scan chain 133 is identical to scan chain 134. Accordingly, the outputs of scan chains 131 and 132 can be XOR-ed during each test clock cycle in order to perform a comparison. Similarly, the outputs of scan chains 133 and 134 can also be XOR-ed during each clock cycle.

If none of the cores in either SPE 110 or 111 return a faulty response for a given clock cycle, both inputs to XOR gate 136 will be a logical '0', which will result in a logical '0' at the output of the XOR gate 136. However, if either one or more of the cores in SPE 110 or one or more of the cores in SPE 111 return a faulty response in any given clock cycle, one of the inputs to XOR gate 136 will be a logical '1' which will result in a logical '1' at the output of the XOR gate 136.

The output of the XOR gate represents a single-bit fault signature for the respective scan chains in a cluster (e.g., a $L_0$ cluster). For example, a logical '0' at the output an XOR gate 136 will indicate a fault-free signature while a logical '1' at the output of the XOR gate 136 will indicate a faulty response for the associated scan chains 131 and 132 in cluster 150.

It will be appreciated that in rare circumstances aliasing may occur. Aliasing occurs only if all the scan cells carry faults on the same cycle. For example, if both scan chains 131 and 132 produce a fault on the same clock cycle, a logical '1' will be presented at both inputs of XOR gate 136 resulting in a logical '0' at the output of the XOR gate. This is a non-representative edge (or boundary) case that is unlikely to occur for all clock cycles and can, therefore, be accounted for and corrected statistically when analyzing the test results collectively.

Thereafter, the outputs of the XOR gates (e.g. outputs 145 and 146) may then be OR-ed together to produce a one-bit fault signature for two or more clusters, where a logical '0' represents a fault-free signature and a logical '1' represents a fault in at least one cluster at the base-level (e.g., at the $L_0$ level).

FIG. 1B illustrates the manner in which the scan outputs of multiple super cores at the base level can be compacted using an XOR-OR gate in accordance with an embodiment of the present invention. FIG. 1B illustrates the manner in which an XOR-OR compaction may be performed for identical chains of SPEs.

As discussed in connection with FIG. 1A, the XOR output of each cluster represents a single-bit fault signature for the respective scan chains in a cluster. Referencing FIG. 1B, for example, the outputs of XOR gates 171 and 172, each represent fault-signatures for the scan chains in an associated cluster. For example, XOR gate 171 may be equivalent to XOR gate 136 in FIG. 1A while XOR gate 172 may be equivalent to XOR gate 137 in FIG. 1A. The outputs of the XOR gates 171 and 172 may, therefore, be equivalent to output signals 145 and 146 respectively (as shown in FIG. 1A).

Referencing FIG. 1B, the outputs of the XOR gates can then be OR-ed using OR gate 173 during each clock cycle to produce a single-bit signature for the two or more of the clusters at the $L_0$ compaction level shown in FIG. 1A. It should be noted that there may be several clusters at the $L_0$ compaction level of the architecture, the outputs of which are OR-ed together to produce a single-bit error signature for the clusters for each clock cycle. In the example of FIG. 1B, output 174 represents a single-bit error signature for the two clusters of FIG. 1A at the $L_0$ compaction level.

Note that the XOR-OR comparison scheme shown in FIGS. 1A and 1B is invoked at each clock cycle. In other words, during each clock cycle a comparison is taking place of the scan chain outputs of the SPEs to generate a single bit fault signature for the clusters.

Figure 2:
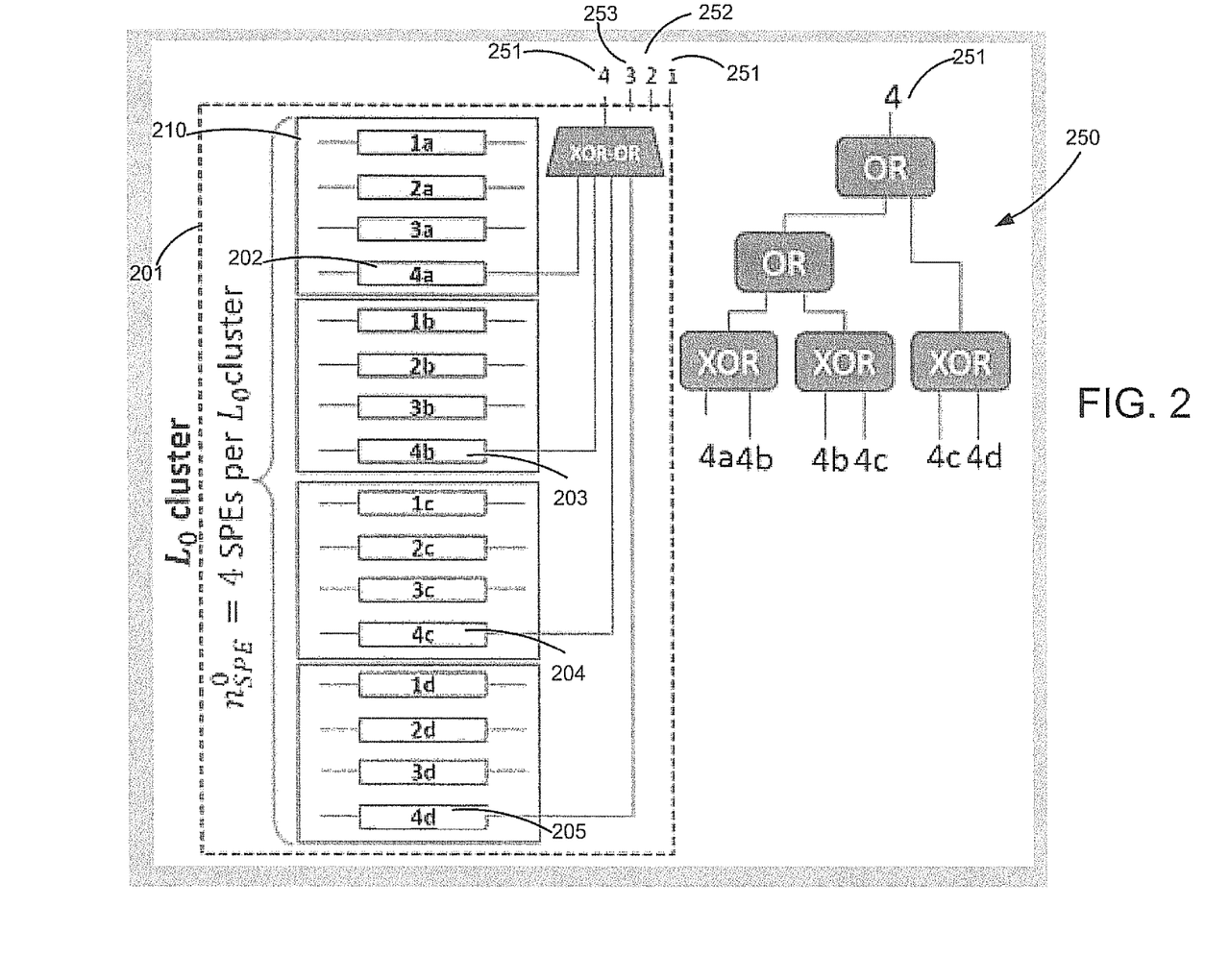
FIG. 2 illustrates an exemplary cluster comprising four scan chains and four super processing engines (SPEs) where all the processing engines (PEs) in the SPEs are configured as a single piece of logic in accordance with an embodiment of the present invention.

FIG. 2 illustrates an exemplary cluster comprising four scan chains and four super processing engines (SPEs) where all the processing engines (PEs) in the SPEs are configured as a single piece of logic in accordance with an embodiment of the present invention.

The cluster 201 comprises 4 SPEs. Each SPE, e.g., SPE 210 within cluster 201 comprises 4 scan chains. FIG. 2 does not illustrate any discrete PEs within the SPE because from an ATPG perspective, all the PEs in an SPE are configured as a single piece of logic (or a single circuit) comprising 4 scan chains. The 4 scan chains may be different from each other, but each scan chain traverses each of the 4 SPEs as shown in FIG. 1A. For example, scan chain 4a 202, scan chain 4b 203, scan chain 4c 204 and scan chain 4d 205 are all identical (e.g., associated with scan chain 4) and traverse through the 4 different SPEs. Accordingly, scan chains 4a 202, 4b 203, 4c 204 and 4d 205 can all be inputted into XOR-OR compaction network 250 and compared to generate a single-bit signature 251. Similarly, the three other scan chains (e.g., 1a-1d, 2a-2d, 3a-3d) may also be compared using an XOR-OR network to generate respective single-bit signatures (e.g., signature 251 for scan chain 1a-1d, signature 252 for scan chain 2a-2d, and signature 253 for scan chain 3a-3d) for each clock cycle. In this way the XOR and OR gates at the $L_0$ level act as comparators that yield a single bit fault signature for a respective scan chain for each clock cycle. Note that the XOR-OR network shown is just one possible implementation among many options.

Figure 3:
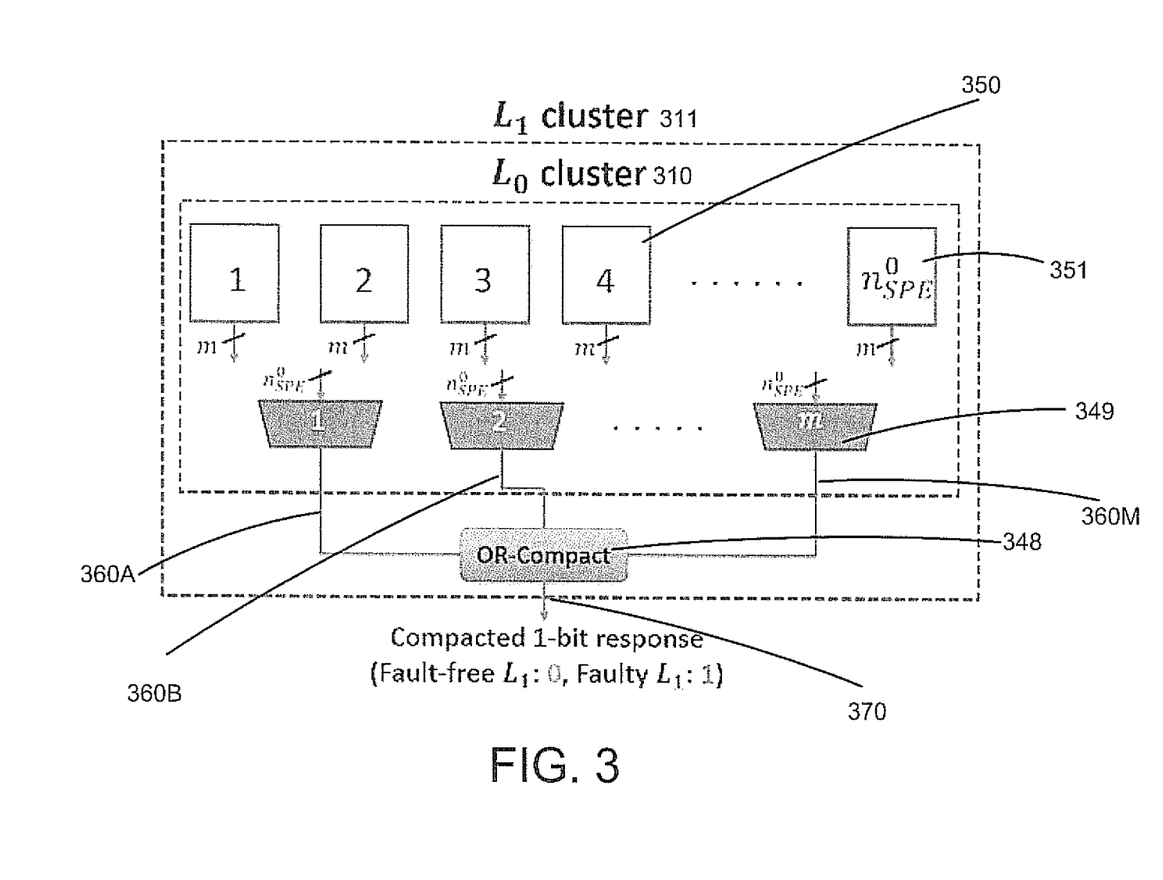
FIG. 3 illustrates the manner in which an OR compaction using combinational logic is performed on the outputs of the clusters at the base level in accordance with an embodiment of the present invention.

FIG. 3 illustrates the manner in which an OR compaction using combinational logic is performed on the outputs of the clusters at the base level in accordance with an embodiment of the present invention.

As discussed in connection with FIGS. 1A, 1B and 2, identical scan chains in each cluster are compared using XOR and OR gates to produce a single-bit fault signature for each cluster. The outputs at the base level (or $L_0$ level) can be subsequently compacted by OR-ing them at the next level of hierarchy using OR-compactor 348. As shown in FIG. 3, the "m" scan-chains associated with each SPE (e.g., SPEs 350, 351) of the $L_0$ cluster 350 are all XOR-ed and OR-ed together using XOR-OR network (e.g., network 349), where the number of SPEs per $L_0$ cluster is represented by $n^0_{SPE}$. The outputs of the XOR-OR gates (e.g., outputs 360A, 360B . . . 360M) can then be OR-ed together at the next level of hierarchy (e.g., at the $L_1$ cluster 311 level) to further compact the test results. In this way, while the test compactor for the present invention has multiples levels of hierarchy (as will be explained below), the first level is typically an XOR-OR based comparator.

It should be noted that while the OR-compaction network 348 in FIG. 3 only illustrates compacting the outputs of a single $L_0$ cluster, there may be several $L_0$ clusters within the $L_1$ cluster 311 at the base-level with outputs that are compacted using respective OR-compaction networks. In other words, there may be several $L_0$ clusters within the $L_1$ cluster 311, the outputs of which are compacted using associated OR-compaction networks (similar to OR-compaction network 348).

In one embodiment, OR-compaction network 348 may be comprised of an OR-gate tree with "m" inputs and (m−1) 2-input OR-gates.

It is appreciated that the output 370 of the $L_1$ cluster 311 if there are no errors within any of the PEs (or scan chains) will be a logical '0' for that clock cycle indicating a fault-free $L_1$ cluster 311. However, a logical '1' at the output 370 of the $L_1$ cluster 311 indicates that a fault was found in at least one of the scan chains comprised within the one or more $L_0$ clusters.

Figure 4:
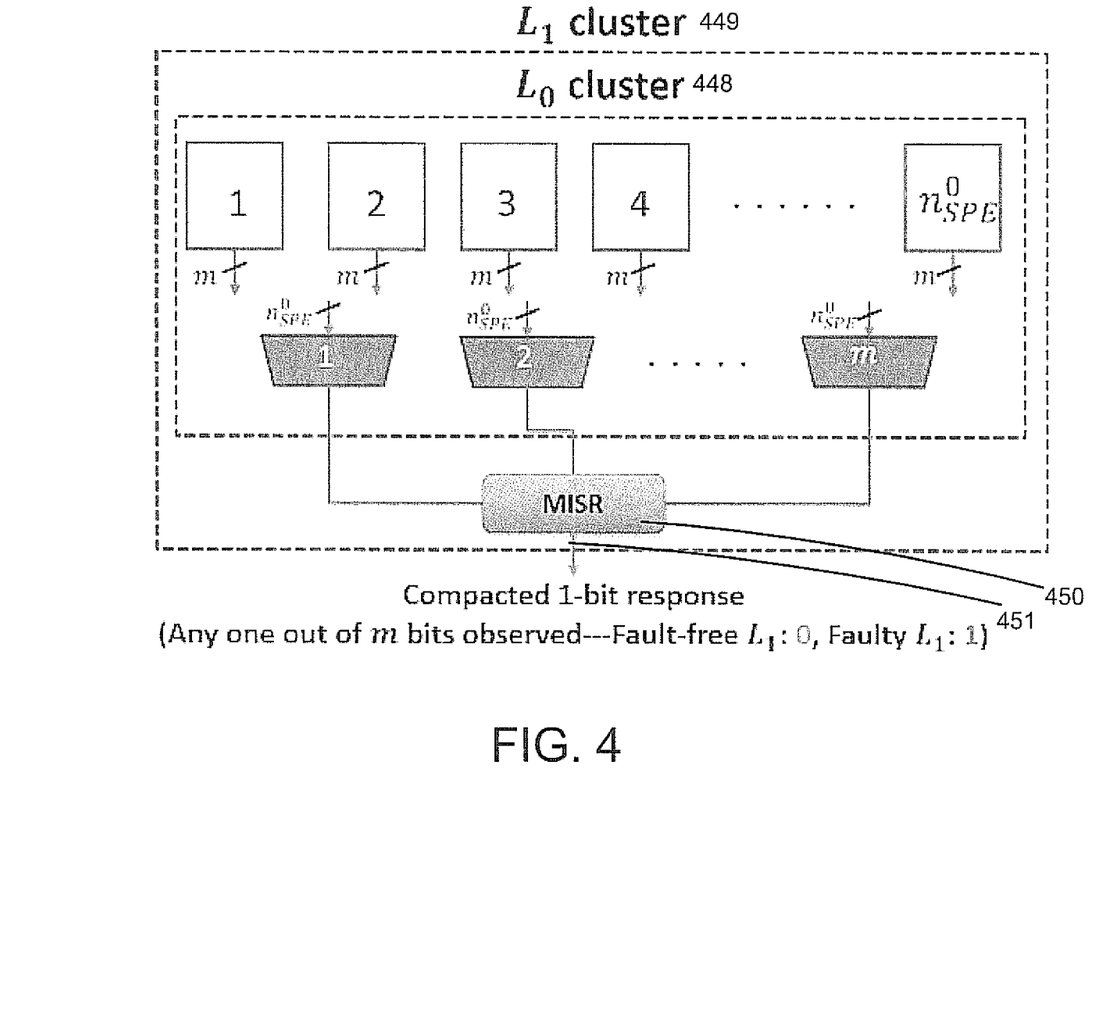
FIG. 4 illustrates the manner in which compaction is performed on the outputs of the clusters at the base level with a multiple input shift register (MISR) in accordance with an embodiment of the present invention.

FIG. 4 illustrates the manner in which compaction is performed on the outputs of the clusters at the base level with a multiple input shift register (MISR) in accordance with an embodiment of the present invention. Similar to FIG. 3, FIG. 4 illustrates that the "m" scan-chains associated with the $n^0_{SPE}$ SPEs of the $L_0$ cluster 448 are all XOR-ed and OR-ed together using one or more XOR-OR networks (where the number of SPEs per $L_0$ cluster is represented by $n^0_{SPE}$).

Instead of an OR-compactor, however, FIG. 4 uses a MISR 450 to compact the outputs of the XOR-gates from the $L_0$ cluster. It is appreciated that for testable design purposes, a multiple-input shift register may be used to accelerate the testing task by compressing multiple-input data streams into one signature. In one embodiment, a MISR with "m" inputs (e.g., MISR 451 shown in FIG. 4) may comprise "m" flip-flops, and a maximum of "m(m−1)" 2-input XOR gates, which is a typical implementation among many possible options.

Output 451 of the $L_1$ cluster 449 if there are no errors within any of the PEs (or scan chains) will be a logical '0' indicating a fault-free $L_1$ cluster 449, with ignorable aliasing probability. However, a logical '1' at the output 451 of the $L_1$ cluster 449 indicates that a fault was found in at least one of the scan chains comprised within the one or more $L_0$ clusters.

It is appreciated that an OR-gate comprises combinational logic and, accordingly, it is considered a spatial compactor. On the other hand, a MISR is a sequential element comprising sequential circuits, e.g., flip-flops and, accordingly, is considered a temporal compactor. Note that the temporal compactors, e.g., MISRs are used for both compaction and for re-timing. Compared with a spatial compactor, a temporal compactor is more complicated and costly with respect to hardware overhead.

In many instances, when compacting the outputs of potentially thousands of $L_0$ clusters at the base-level, if only combinational logic (e.g., OR gates) is used, the 1-bit signals from a cluster may need to be routed over long distances to the next stage of the circuitry, which consumes time and may slow down the speed of the chip. The delay from the combinational circuitry may accumulate on the test paths and the test clock will typically need to be slowed down. Accordingly, sequential logic may be needed to break or split the long routes so that the longest timing paths in the chip are shorter. In one embodiment, a re-timing register may be used to shorten the test paths and increase the test clock speed. However, in the embodiment shown in FIG. 4, a MISR is used. The MISR 450 is a sequential logic element and, when used, instead of combinational logic elements, e.g., OR-gates, can advantageously help speed up the test and increase the test frequency. The MISR is a temporal compactor that functionally acts as both a compactor as well as one or more re-timing registers so test clock speed can advantageously be increased. This eliminates the need of dedicated retiming registers that are used to improve test speed, and hence can positively affect overall cost.

Figure 5:
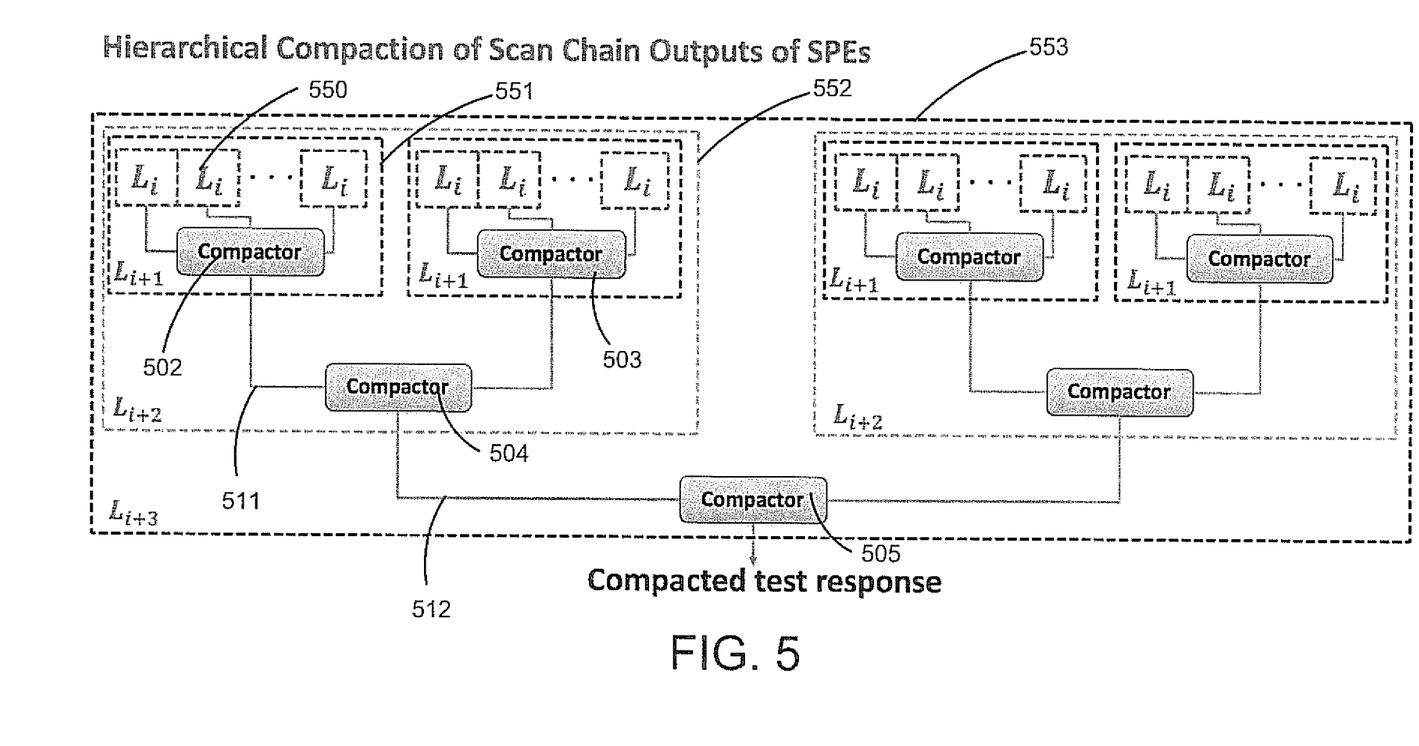
FIG. 5 illustrates an exemplary manner in which the scan chain outputs of SPEs in a many-core processor can be hierarchically compacted utilizing a hybrid combination of both spatial and temporal compactors in accordance with an embodiment of the present invention.

FIG. 5 illustrates an exemplary manner in which the scan chain outputs of SPEs in a many-core processor can be hierarchically compacted utilizing a hybrid combination of both spatial and temporal compactors in accordance with an embodiment of the present invention.

As noted above, embodiments of the present invention relate to a hierarchical test compaction methodology that utilizes a hybrid combination of both spatial and temporal compactors. The compaction of the test results from the various clusters can take place using varying hierarchical levels. For example, certain many-core processors with fewer clusters may require fewer levels of hierarchy to compact all the test results while many-core processors with a higher number of clusters would in general require many levels of hierarchy. As will be discussed below, the number of levels in the hierarchical may be determined based on a cost analysis and function.

As shown in FIG. 5, the output of the clusters at the base-level of the hierarchy (e.g., $L_i$ clusters 550) can be compacted down to produce a single-bit fault signature (e.g., signal 511) using compactor 502. Note that each of the $L_i$ clusters (e.g., cluster 550) comprises XOR and OR gates (not shown in FIG. 5) that perform the comparison of the various scan chains within the cluster before the outputs of the various $L_i$ clusters are presented to compactor 502. In other words, each of the $L_i$ clusters internally comprises the comparators (comprising XOR and OR gates) to produce single bit outputs that are inputted into compactor 502. As noted previously, the first level of the hierarchy is typically an XOR-OR based comparator.

The resulting compacted signal 511 at the $L_{i+1}$ level of hierarchy (outputted from $L_{i+1}$ cluster 551) can be further compacted down along with the outputs of the other $L_{i+1}$ clusters (within the $L_{i+2}$ cluster 552) using compactor 504 to yield a single bit fault signature 512 at the $L_{i+3}$ level. The output 512 of $L_{i+2}$ compactor 552 can be compacted with the output of other $L_{i+2}$ clusters using compactor 505 to yield a single bit fault signature at the output of the $L_{i+3}$ cluster 553 (which, for the example shown in FIG. 5, comprises the highest level in the hierarchical configuration of the many-core chip). It should be noted that the solid lines in FIG. 5 all indicate single-bit signal pathways (e.g., signals 511, 512).

In this way, all the $L_0$ clusters at the base-level of the hierarchy can be organized hierarchically and the results can be compacted using a combination of spatial and temporal compactors to produce a single bit fault signature for the entire chip. The compaction scheme relates to a pass/fail test, so each cluster produces a single bit signature that can be further compacted at higher levels of the hierarchy by combining the result with other clusters (using OR-gates or MISRs). A user (or a test program programmed to receive results) may only need to check if a '1' appears at the output of a compactor, e.g., compactor 505 in FIG. 5, at the end of any clock cycle to determine if there was a fault in any of the clusters for that cycle. In this way, many scan chain outputs are reduced to a 1 bit output (per test cycle).

It should be noted that the compactors at any level of the hierarchy, e.g., compactor 502, 504, 505, may either be an OR-compactor or a MISR. Embodiments of the present invention use a cost function to determine the optimal hierarchical compaction configuration including to determine whether a compactor at any particular level will comprise an OR-compactor or a MISR. The cost model guides users to select the specific compaction architecture (as will be discussed further below).

Figure 6:
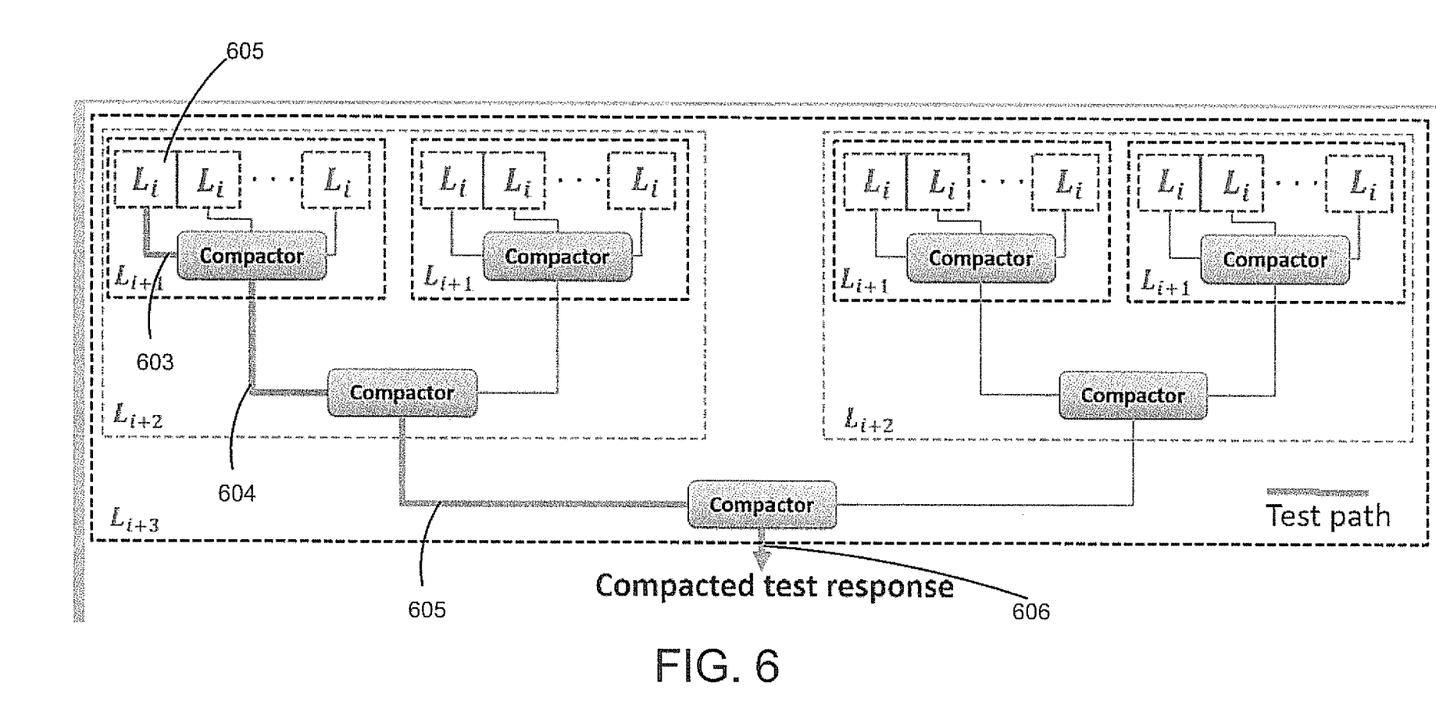
FIG. 6 illustrates a diagram an exemplary manner in which a fault in one of the clusters in a many-core processor may propagate through the hierarchical compaction network in accordance with an embodiment of the present invention.

FIG. 6 illustrates a diagram an exemplary manner in which a fault in one of the clusters in a many-core processor may propagate through the hierarchical compaction network in accordance with an embodiment of the present invention.

As seen in FIG. 6, a fault may occur in cluster 605 at the $L_i$ level (the bottom-most level of the hierarchy). The fault produces a logical '1' on signal 603, where signal 603 may be an output of an XOR gate associated with $L_i$ cluster 605. The logical '1' on signal 603 gets compacted along with other signals from $L_i$ clusters to produce signal 604. As shown in the figure, the logical '1' propagates to signal 604, which in turn then propagates to signal 605 and, subsequently to signal 606, thereby, indicating a fault at the output of the $L_{i+3}$ cluster (the highest level cluster of the hierarchy), assuming aliasing is not high enough to mask the fault propagation.

Figure 7:
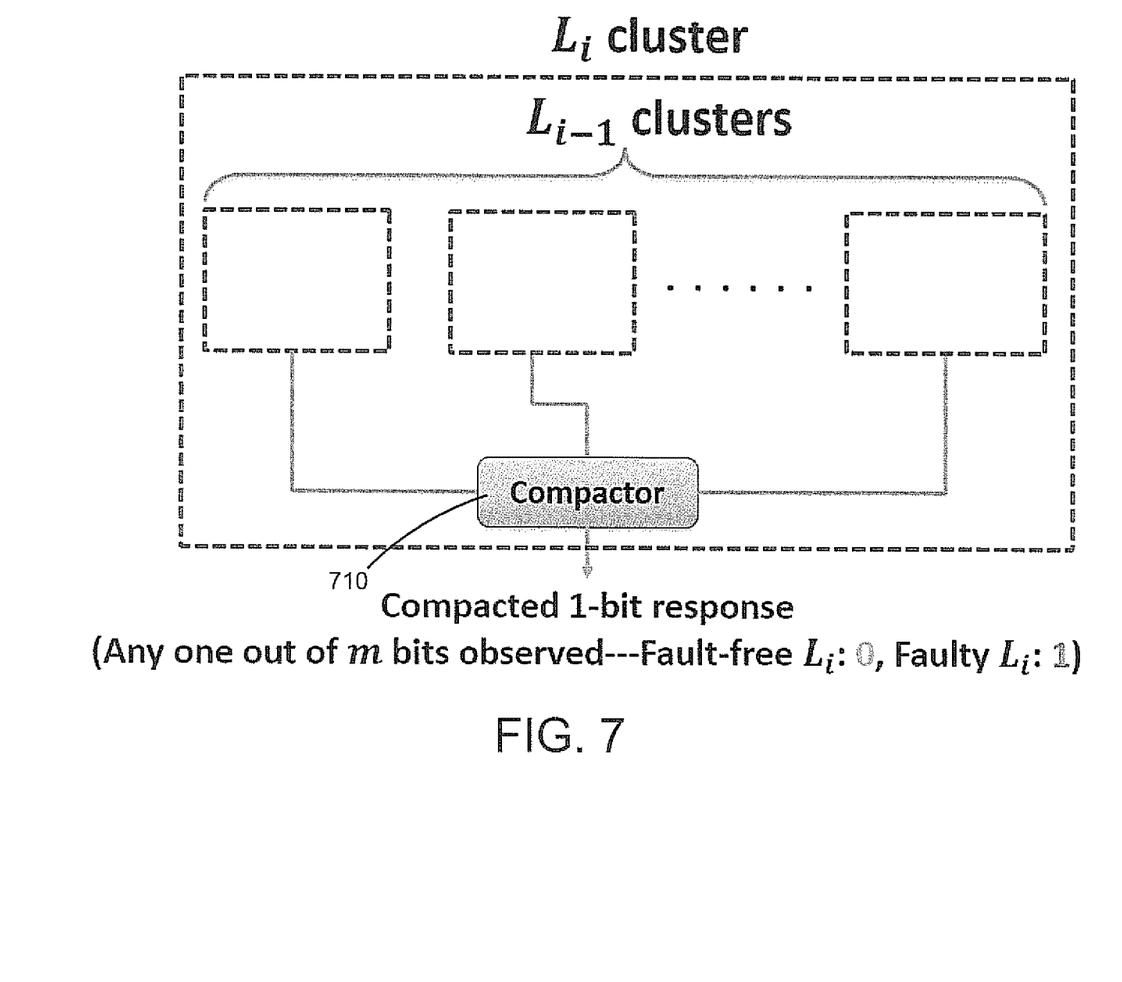
FIG. 7 is a block diagram that illustrates the manner in which outputs of clusters at a given level of hierarchy can be compacted in accordance with an embodiment of the present invention.

FIG. 7 is a block diagram that illustrates the manner in which outputs of clusters at a given level of hierarchy can be compacted in accordance with an embodiment of the present invention.

As shown in FIG. 7, the outputs of any given group of $L_{i-1}$ clusters are compacted together at the next higher level of hierarchy (e.g., the $L_i$ level). All the $L_{1-1}$ clusters within the $L_i$ cluster are compacted using compactor 710. Compactor 710 again may either be an OR-gate based spatial compactor or a MISR-based temporal compactor. At any given level, the determination of whether to use an OR-gate based compactor or a MISR-based compactor is made in accordance with a cost function that determines the optimal hierarchical compaction configuration based on several factors, e.g., area overhead, test time, aliasing probability, debug overhead, debuggability, etc.

As noted above, in an embodiment, a cost function determines the optimal hierarchical compaction configuration for a many-core processor based on several factors. In another embodiment, the cost function may be a cost matrix that is used to compute the optimal configuration.

In one embodiment, the output of the cost function comprises the compaction type at each level, $L_i$. Additionally another output of the cost function is the resulting number of clusters at each level. In other words, the cost function (or cost matrix) helps determine how many clusters, at each level, the cores from the many-core processor will be grouped into. Furthermore, the cost function also determines whether the compactor at each level of hierarchy will be an OR-based compactor or a MISR-based compactor.

Embodiments of the present invention when used along with an appropriate small core-based ATPG method, can advantageously reduce ATPG time and memory requirements by 10x and test time by 2x.

Figure 8:
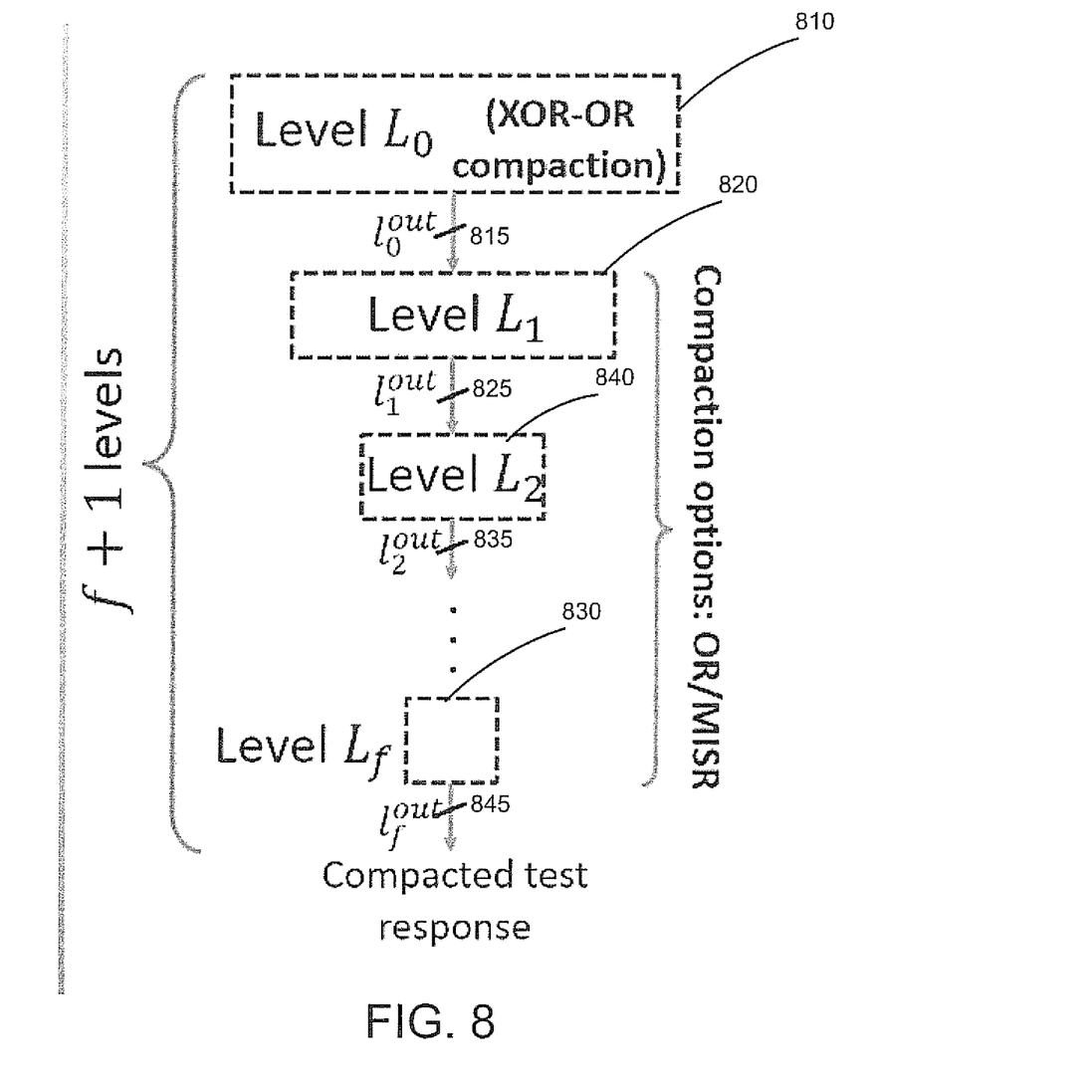
FIG. 8 illustrates a flow diagram illustrating the manner in which the cores at the base level of a many-processor chip are hierarchically compacted in accordance with an embodiment of the present invention.

FIG. 8 illustrates a flow diagram illustrating the manner in which the cores at the base level of a many-processor chip are hierarchically compacted in accordance with an embodiment of the present invention.

As shown in FIG. 8, the scan chains are compared using XOR and OR gates at the $L_0$ level 810 of the hierarchy. The number of $L_0$ clusters ($l_0^{out}$) 815 that is optimal for the many-core processor is determined by the output of the cost function. Additionally, the number of clusters at each level of the hierarchy (except the last level corresponding to $l_f^{out}$ 845), including, for example, $L_i$ clusters ($l_1^{out}$) 825, $L_2$ clusters ($l_2^{out}$) 835, etc. are determined by the cost function. For example, if the number of clusters is fixed, which is also an output of cost function, and if the cost function determines that the chip should be organized into a higher number of layers, then the cluster size for each layer will be smaller.

On the other hand, for designs with fewer layers, the cluster size will be larger. The cost function analyzes the trade-offs for each method of organization based on test cost parameters discussed below to make this determination. The cost function also determines the type of compaction (OR-based or MISR-based) at each level of the hierarchy, including the compaction at level $L_1$ 820, level $L_2$ 840 and the top-most level $L_f$ 830.

The inputs of the cost function or "cost matrix" needs to receive certain inputs to determine the optimal hierarchical compaction configuration. For instance, the inputs to the cost function comprise: a) the number of identical PEs (N) in the many-core processor; b) the number of flip-flops per PE (which provides the size of the core); c) the number of output channels post-compaction ($l_f^{out}$) 845. The number of output channels is determined by the design limit. Given these inputs, the cost function attempts to find an optimized configuration including determining the number of hierarchies, the grouping policies, and the type of compaction.

More specifically, the outputs of the cost function comprise: a) scan chain count "m" inside an SPE; b) $n_{PE}$, the number of PEs inside each SPE at the base level of the hierarchy; c) $n_{SPE}$, the total number of SPEs in the design at the base level of the hierarchy ($n_{SPE}=N/n_{PE}$, where N is the total PE count in the design and is provided by the user as an input to the cost function as indicated above); d) $n^0_{SPE}$, the number of SPEs per $L_0$ cluster ($n^0_{SPE}=n_{SPE}/l_0^{out}$, where $l_0^{out}$ is the number of $L_0$ clusters); e) number of clusters at each level including $L_0$ level clusters ($l_0^{out}$) 815, $L_1$ level clusters ($l_1^{out}$) 825, $L_2$ level clusters ($l_2^{out}$) 835, etc.; and e) the compaction type at each level of hierarchy.

In one embodiment, the cost function or matrix comprises test cost parameters. Test cost parameters may include: a) area overhead (for flops, XOR, and OR gates and how much hardware overhead is needed); b) test time (critical path delay, test cycle count); c) aliasing probability; d) maximum debug overhead (flop count); and e) debuggability. All these various parameters are taken into account in the cost function to produce the outputs discussed above. Embodiments of the present invention may provide user-defined constraint envelopes for one or more test cost parameters to prune design space and recommend optimal set of compaction configurations to the user. Embodiments of the present invention also enable optimization of test-cost (aliasing, test area overhead, and test time) to determine the optimal hierarchical compaction configuration.

Figure 9:
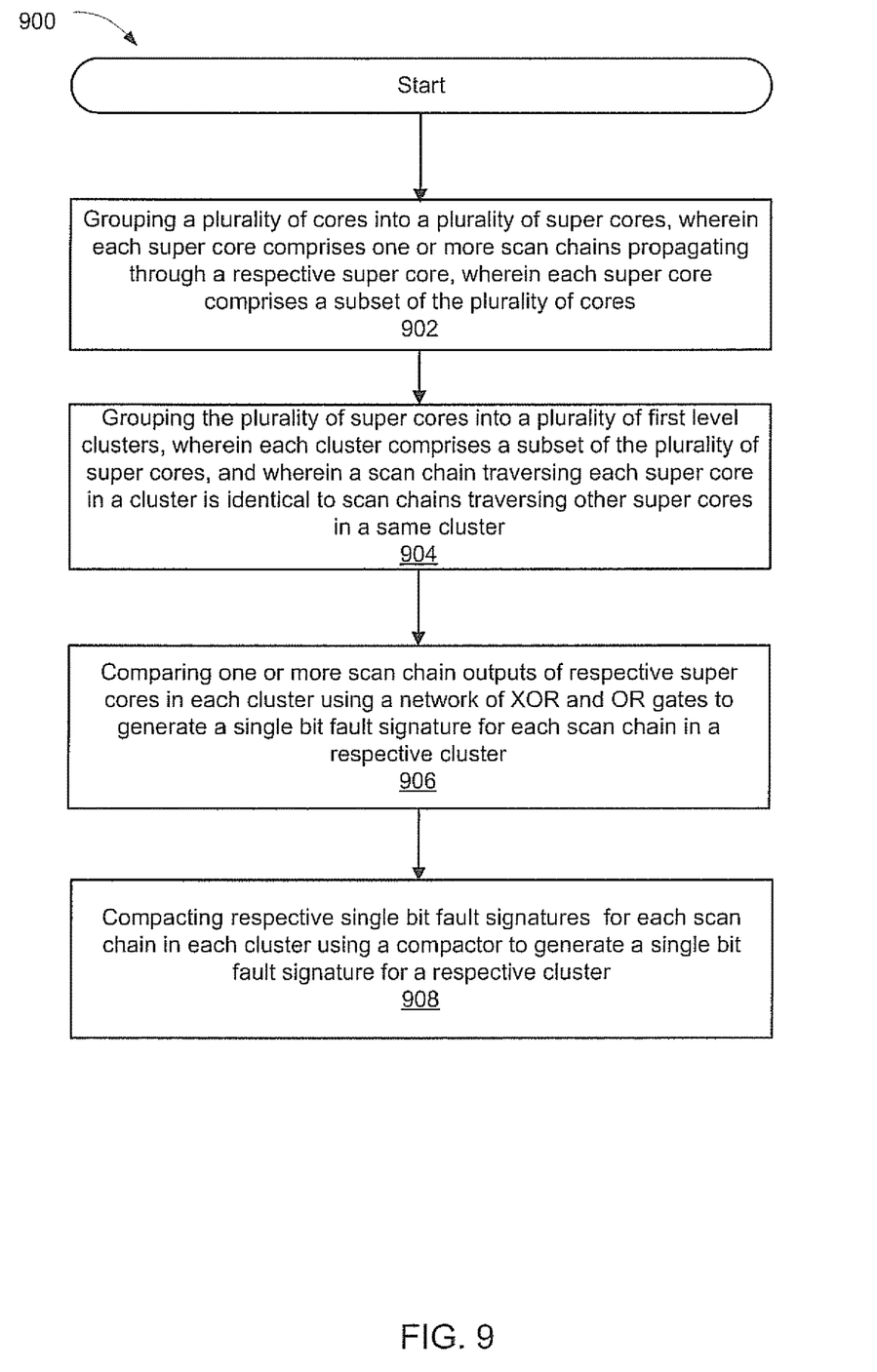
FIG. 9 depicts a flowchart illustrating an exemplary computer-implemented process for hierarchically compacting the test output of cores in a many-core processor utilizing a hybrid combination of both spatial and temporal compactors in accordance with an embodiment of the present invention.

FIG. 9 depicts a flowchart illustrating an exemplary computer-implemented process for hierarchically compacting the test output of cores in a many-core processor utilizing a hybrid combination of both spatial and temporal compactors in accordance with an embodiment of the present invention.

At step 902, a plurality of cores comprised within a many-core processor are grouped into a plurality of super cores. Each super core comprises one or more scan chains that propagate through a respective super core, wherein each super core comprises a subset of the plurality of cores.

At step 904, the plurality of super cores are grouped into a plurality of first level clusters. The plurality of first level clusters comprise clusters at a first level of a hierarchical configuration of clusters (e.g., cluster $L_0$ 310 in FIG. 3). Each cluster of the plurality of clusters comprises a subset of the plurality of super cores, where a scan chain traversing each super core in a cluster is identical to scan chains traversing other super cores in a same cluster.

At step 906, one or more scan chain outputs of respective super cores in each cluster are compared using a network of XOR and OR gates to generate a single bit fault signature for each scan chain in a respective cluster.

Finally, at step 908, respective single bit fault signatures for each scan chain in each cluster are compacted using a compactor to generate a single bit fault signature for a respective cluster. As noted previously, the compactor can either be a spatial compactor (e.g. a network of OR-gates comprising combinational logic) or a temporal compactor (e.g. a MISR comprising sequential logic).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A system for performing a method of testing a many-core processor, the system comprising:
   a processing device communicatively coupled with a memory comprising:
   a plurality of cores comprised within the many-core processor grouped into a plurality of super cores, wherein each super core comprises one or more scan chains that propagates there through, wherein each super core comprises a respective subset of the plurality of cores, and wherein the plurality of super cores are grouped into a plurality of first level clusters, wherein the plurality of first level clusters comprise clusters at a first level of a hierarchical cluster configuration, wherein each first level cluster of the plurality of first level clusters comprises a respective subset of the plurality of super cores, wherein the plurality of first level clusters are grouped into a plurality of second level clusters, wherein the plurality of second level of clusters comprise clusters at a second level of the hierarchical cluster configuration of clusters, and wherein each second level cluster of the plurality of second level clusters comprises a respective subset of the plurality of first level clusters;
   a network of combinational logic, wherein one or more scan chain outputs of respective super cores in each first level cluster are compared using the network of combinational logic to generate a single bit fault signature for each scan chain in a respective first level cluster for each clock cycle, wherein a respective scan chain traversing each super core in a first level cluster is identical to a respective scan chain traversing other super cores in a same first level cluster;
   a first compactor, wherein respective single bit fault signatures for each scan chain in each first level cluster are compacted using a first compactor to generate a single bit fault signature for a respective first level cluster for each clock cycle; and
   a second compactor operable to compact respective single bit fault signatures for each first level cluster in a second level cluster to generate a single bit fault signature for each second level cluster.

2. The system of claim 1, wherein the first compactor comprises one or more OR gates.

3. The system of claim 1, wherein the first compactor comprises a multiple input shift register (MISR).

4. The system of claim 1, wherein the network of combinational logic comprises XOR and OR gates.

5. The system of claim 1, wherein a number of levels in the hierarchical cluster configuration for grouping the plurality of cores in the many-core processor are determined in accordance with a cost function.

6. The system of claim 5, wherein a type of compactor to be used for the first compactor and the second compactor is determined in accordance with the cost function.

7. The system of claim 6, wherein the type of compactor is selected from a group consisting of: OR-based compactor and a multiple input shift register (MISR).

8. The system of claim 7, wherein the cost analysis is performed in accordance with a cost function.

9. The system of claim 7, wherein the cost analysis is performed in accordance with a cost matrix.

10. The system of claim 7, wherein the cost analysis is performed by considering a plurality of factors selected from a group consisting of: area overhead, test time, aliasing probability, maximum debug overhead and debuggability.

11. A computer-implemented method of testing a many-core processor, the method comprising:
    comparing one or more scan chain outputs of respective super cores in each first level cluster of a plurality of first level clusters using a network of combinational logic to generate a single bit fault signature for each scan chain in a respective first level cluster for each clock cycle, wherein a plurality of cores comprised within the many-core processor are grouped into a plurality of super cores, wherein each super core comprises one or more scan chains that propagate there through, wherein each super core comprises a respective subset of the plurality of cores, wherein the plurality of super cores are grouped into the plurality of first level clusters, wherein the plurality of first level clusters comprise clusters at a first level of a hierarchical cluster configuration, wherein each first level cluster of the plurality of first level clusters comprises a respective subset of the plurality of super cores, and wherein a respective scan chain traversing each super core in a first level cluster is identical to respective scan chains traversing other super cores in a same first level cluster, wherein the plurality of first level clusters are grouped into a plurality of second level clusters, wherein the plurality of second level of clusters comprise clusters at a second level of the hierarchical cluster configuration of clusters, and wherein each second level cluster of the plurality of second level clusters comprises a respective subset of the plurality of first level clusters;
    compacting respective single bit fault signatures for each scan chain in each first level cluster using a first compactor to generate a single bit fault signature for a respective first level cluster for each clock cycle; and
    compacting respective single bit fault signatures for each first level cluster in a second level cluster using a second compactor to generate a single bit fault signature for each second level cluster.

12. The computer-implemented method of claim 11, wherein the first compactor comprises one or more OR gates.

13. The computer-implemented method of claim 11, wherein the first compactor comprises a multiple input shift register (MISR).

14. The computer-implemented method of claim 11, wherein the network of combinational logic comprises XOR and OR gates.

15. A non-transitory computer-readable storage medium having stored thereon, computer executable instructions that, if executed by a computer system cause the computer system to perform a method of testing a many-core processor, the method comprising:

comparing a scan chain output of respective super cores in each first level cluster of a plurality of first level clusters using a network of combinational logic to generate a single bit fault signature for each first level cluster, wherein a plurality of cores comprised within the many-core processor is grouped into a plurality of super cores, wherein each super core comprises a scan chain that propagates there through, wherein each super core comprises a respective subset of the plurality of cores, wherein the plurality of super cores are grouped into the plurality of first level clusters, wherein the plurality of first level clusters comprise clusters at a first level of a hierarchical cluster configuration, wherein the plurality of first level clusters are grouped into a plurality of second level clusters, wherein the plurality of second level of clusters comprise clusters at a second level of the hierarchical cluster configuration of clusters, wherein each first level cluster of the plurality of first level clusters comprises a respective subset of the plurality of super cores, wherein each second level cluster of the plurality of second level clusters comprises a respective subset of the plurality of first level clusters, and wherein a respective scan chain traversing each super core in a first level cluster is identical to a respective scan chain traversing other super cores in a same first level cluster;

compacting respective single bit fault signatures of each first level cluster using a first compactor to generate a single bit fault signature for the plurality of first level clusters; and compacting respective single bit fault signatures for each first level cluster in a second level cluster using a second compactor to generate a single bit fault signature for each second level cluster.

16. The non-transitory computer-readable storage medium of claim 15, wherein the first compactor comprises one or more OR gates.

17. The non-transitory computer-readable storage medium of claim 15, wherein the first compactor comprises a multiple input shift register (MISR).

18. The non-transitory computer-readable storage medium of claim 15, wherein the network of combinational logic comprises XOR and OR gates.

* * * * *